US012451378B2

United States Patent
Jang

(10) Patent No.: US 12,451,378 B2
(45) Date of Patent: Oct. 21, 2025

(54) WAX COATING APPARATUS FOR WAFER MOUNTING AND WAFER MOUNTING APPARATUS INCLUDING SAME

(71) Applicant: SK SILTRON CO., LTD., Gumi-si (KR)

(72) Inventor: Kwang Nyeong Jang, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 438 days.

(21) Appl. No.: 18/106,931

(22) Filed: Feb. 7, 2023

(65) Prior Publication Data
US 2023/0253220 A1   Aug. 10, 2023

(30) Foreign Application Priority Data
Feb. 10, 2022   (KR) .................. 10-2022-0017484

(51) Int. Cl.
*H01L 21/67* (2006.01)
*H01L 21/683* (2006.01)

(52) U.S. Cl.
CPC .... *H01L 21/6715* (2013.01); *H01L 21/67103* (2013.01); *H01L 21/6838* (2013.01)

(58) Field of Classification Search
None
See application file for complete search history.

(56) References Cited

U.S. PATENT DOCUMENTS

| | | | | |
|---|---|---|---|---|
| 5,942,035 | A * | 8/1999 | Hasebe | H01L 21/67017 118/313 |
| 9,027,508 | B2 * | 5/2015 | Hatakeyama | H01L 21/6715 118/695 |
| 9,205,441 | B2 * | 12/2015 | Sasaki | B05D 7/146 |
| 10,864,530 | B2 * | 12/2020 | Wang | B05B 1/30 |
| 11,185,884 | B2 * | 11/2021 | Tomari | B05D 3/12 |
| 11,491,727 | B2 * | 11/2022 | Seo | B33Y 80/00 |
| 11,569,114 | B2 * | 1/2023 | Sarode Vishwanath | H01L 21/6833 |
| 11,587,820 | B2 * | 2/2023 | Kashiwazaki | H01L 21/6833 |

(Continued)

FOREIGN PATENT DOCUMENTS

| | | |
|---|---|---|
| CN | 203232900 U | 10/2013 |
| CN | 109417047 A | 3/2019 |

(Continued)

OTHER PUBLICATIONS

Office Action for Chinese Patent Application No. 202310147158.0 dated Jul. 25, 2025, 13 pages.

*Primary Examiner* — Jethro M. Pence
(74) *Attorney, Agent, or Firm* — Lewis Roca Rothgerber Christie LLP

(57) ABSTRACT

A wax coating apparatus for wafer mounting of the embodiment includes: a vacuum chuck in which a vacuum flow path providing vacuum pressure is embedded; a heating plate mounted on an upper side of the vacuum chuck and having holes and grooves connected to the vacuum flow path of the vacuum chuck in order to suck a block to which a wafer is adhered; a rotating shaft connected to a lower side of the vacuum chuck; a driving motor for rotating the rotating shaft; and a wax nozzle provided to be spaced apart from the upper side of the vacuum chuck, wherein the heating plate may be operated so as to heat the block while the wax nozzle sprays wax on the block.

10 Claims, 5 Drawing Sheets

(56) References Cited

U.S. PATENT DOCUMENTS

| | | | |
|---|---|---|---|
| 12,308,261 B2* | 5/2025 | Ito | H01L 21/67109 |
| 2012/0308715 A1* | 12/2012 | Miyamoto | H01L 21/67173 |
| | | | 118/602 |
| 2015/0266054 A1* | 9/2015 | Komatsubara | B05C 11/1039 |
| | | | 427/420 |
| 2015/0348779 A1* | 12/2015 | Wang | B05B 15/60 |
| | | | 438/782 |
| 2017/0133245 A1* | 5/2017 | Iizuka | H01L 21/67069 |
| 2019/0270110 A1* | 9/2019 | Urakami | B05B 13/04 |
| 2021/0039126 A1* | 2/2021 | Urakami | B05B 13/04 |
| 2023/0317501 A1* | 10/2023 | Ito | H01L 21/67132 |
| | | | 438/464 |

FOREIGN PATENT DOCUMENTS

| | | |
|---|---|---|
| CN | 208789086 U | 4/2019 |
| CN | 110201851 A | 9/2019 |
| CN | 211305632 U | 8/2020 |
| JP | 2013-082017 A | 5/2013 |
| JP | 2017-092267 A | 5/2017 |
| KR | 2012-0108420 A | 10/2012 |
| KR | 10-2016-0134930 A | 11/2016 |
| KR | 10-2018-0061754 A | 6/2018 |
| KR | 10-2019-0030929 A | 3/2019 |
| KR | 10-2020-0045608 A | 5/2020 |
| KR | 2020-0131668 A | 11/2020 |
| WO | WO 2019/004620 A1 | 1/2019 |

\* cited by examiner

WAX COATING APPARATUS FOR WAFER MOUNTING AND WAFER MOUNTING APPARATUS INCLUDING SAME

CROSS-REFERENCE TO RELATED APPLICATIONS

The present application claims priority under 35 U.S.C. 119 and 35 U.S.C. 365 to Korean Patent Application No. 10-2022-0017484 (filed on Feb. 10, 2022), which is hereby incorporated by reference in its entirety.

TECHNICAL FIELD

The present disclosure relates to a wax coating apparatus for wafer mounting capable of simplifying a process and a wafer mounting apparatus including the same.

BACKGROUND

In general, a wafer is fabricated through a polishing process in which a single crystal ingot is thinly sliced and then a surface of the wafer is planarized and mirror-treated.

Generally, the polishing process may simultaneously polish both sides of the wafer or polish only one side surface of the wafer, and a wax adhesion method in which the wafer is adhered to a ceramic block with wax is mainly used as a method of polishing one side surface of the wafer.

In detail, in a wafer mounting apparatus, one side of a wafer adheres to a ceramic block with wax, and a wafer polishing apparatus polishes the other side surface of the wafer with a polishing pad. The polishing process of the wax adhesion method is widely used because it is excellent in processing quality of the wafer.

FIG. 1 is a view schematically illustrating an apparatus for polishing one surface of a wafer.

As shown in FIG. 1, a wafer polishing apparatus for polishing one surface of a wafer includes a polishing head 10 on which a wafer W to be polished is mounted and rotatably installed, a plate 30 on which a polishing pad 20 for polishing the wafer W is adhered below the polishing head 10, a surface plate 40 rotated together with the plate 30, and a slurry supply nozzle 50 that supplies a slurry supplied from a separate slurry tank between a surface of the wafer W and the polishing pad 20.

The wafer W is adhered to a block 11 by using an adhesive such as wax, and the block 11 is mounted on the polishing head 10.

When the wafer W is mounted on the polishing head 10, and when the polishing head 10 and the polishing plate 40 rotate in a state in which the wafer W and the polishing pad 10 are in contact with each other, the wafer W is polished by the polishing pad 20.

A process of adhering a wafer to a block in the related art is as follows.

When the block is loaded into a wax coating unit, the wax is coated while rotating the block immediately after spraying the wax on the block from the wax coating unit, the block is moved from the wax coating unit to a wax heating unit, and then the block is heated in the wax heating unit to increase the adhesion of the wax coated to the block. Thereafter, when the block is moved from the wax heating unit to a wafer adhering unit, the wafer is loaded into the wafer adhering unit, and the wafer is adhered to a wax-coated surface of the block in the wafer adhering unit.

However, according to the related art, there is a problem that a process time is increased and productivity is reduced because the process of moving the block after coating the wax to the block, and heating the block is separately performed.

SUMMARY

Technical Problem

The present disclosure has been made to solve problems of the related art and is directed to providing a wax coating apparatus for wafer mounting that may simplify a process and a wafer mounting apparatus including the same.

Technical Solution

A wax coating apparatus for wafer mounting of the embodiment includes: a vacuum chuck in which a vacuum flow path providing vacuum pressure is embedded; a heating plate mounted on an upper side of the vacuum chuck and having holes and grooves connected to the vacuum flow path of the vacuum chuck in order to suck a block to which a wafer is adhered; a rotating shaft connected to a lower side of the vacuum chuck; a driving motor for rotating the rotating shaft; and a wax nozzle provided to be spaced apart from the upper side of the vacuum chuck, wherein the heating plate may be operated so as to heat the block while the wax nozzle sprays wax on the block.

The driving motor may rotate the vacuum chuck by the rotating shaft while the wax nozzle sprays the wax to the block, and the heating plate may be operated in conjunction with at least one of the driving motor and the wax nozzle.

The heating plate may be mounted on the upper side of the vacuum chuck by a plurality of fastening parts positioned at a predetermined interval in a circumferential direction.

The heating plate may be composed of a disk shape of which a diameter smaller than a diameter of the block and greater than a radius of the block.

The heating plate may include an upper plate made of a metal and a heater adhered to a lower side of the upper plate.

The upper plate may include a central hole communicating with the vacuum flow path of the vacuum chuck at a center thereof, a pair of linear-shaped grooves crossing each other based on the central hole, and a ring-shaped groove connecting both ends of the linear-shaped grooves to each other.

The wafer mounting apparatus of the embodiment may include: a block loading unit providing a block; a wafer loading unit providing a wafer; a wax coating unit that heats the block while coating wax to the block provided from the block loading unit; and a wafer adhering unit that adheres the wafer provided from the wafer loading unit to a wax-coated surface of the block provided from the wax coating unit.

Advantageous Effects

A wax coating apparatus for wafer mounting according to the embodiment and a wafer mounting apparatus including the same are provided with a heating plate in a vacuum chuck, so that wax coating and heating of a block may be performed at the same time.

Therefore, there is an advantage that a process time may be reduced and productivity may be improved by simplifying a process.

DETAILED DESCRIPTION OF THE EMBODIMENTS

Hereinafter, an embodiment of the present disclosure will be described in detail with reference to the accompanying drawings.

Figure 1:
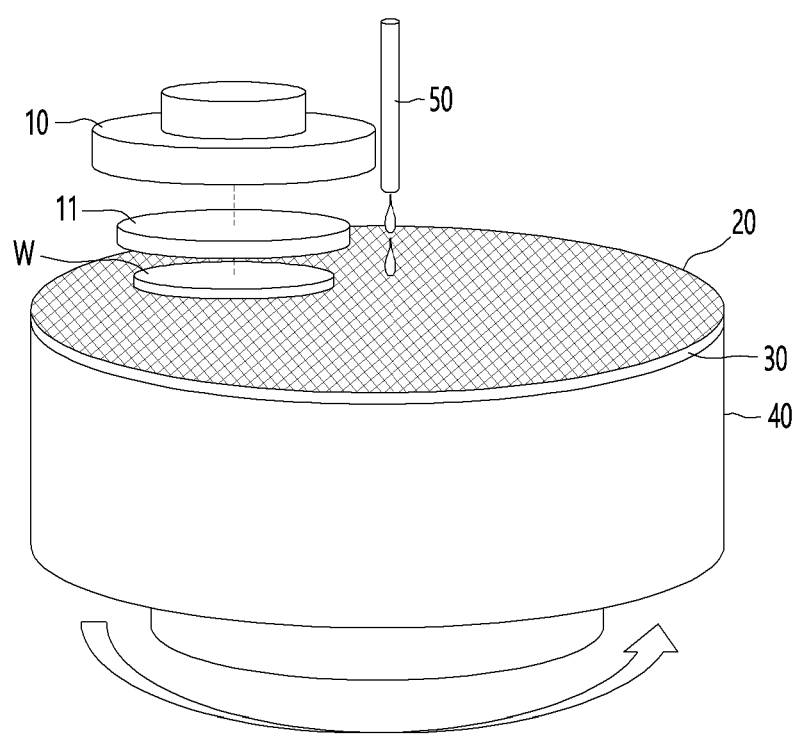
FIG. 1 is a view schematically illustrating an apparatus for polishing one surface of a wafer.
Figure 2:
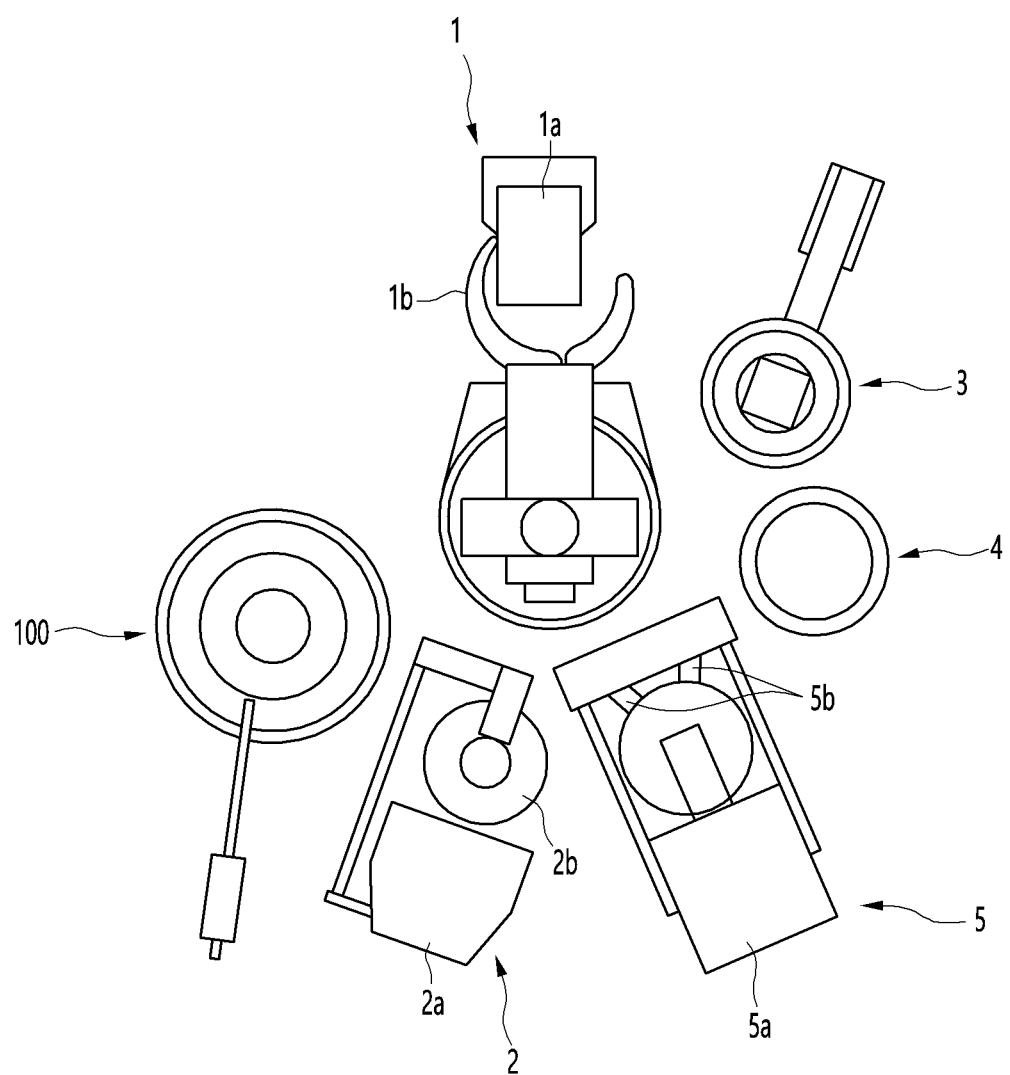
FIG. 2 is a plan view schematically illustrating an apparatus for mounting the wafer according to an embodiment.

FIG. 2 is a plan view schematically illustrating an apparatus for mounting a wafer according to the embodiment.

As shown in FIG. 2, the apparatus for mounting the wafer of the embodiment includes a block loading unit 1 for providing a block, a wafer loading unit 2 for providing the wafer, and heating the block while applying wax to the block, a wax coating unit 100 for cleaning, a wafer adhering unit 3 for adhering the wafer to the block coated with the wax, a cleaning unit 4 for cleaning the wafer adhered to the block immediately after polishing, and a removal unit 5 that removes a cleaned wafer from the block.

The block loading unit 1 may include a block cassette 1a in which blocks are accommodated and a block moving robot 1b that transfers a block B from the block cassette 1a to the wax coating unit 100, but the embodiment is not limited thereto. The block moving robot 1b is positioned at a center of each of the units 1, 2, 100, 3, 4, and 5 and may transfer the block between each of the units 1, 2, 100, 3, 4, and 5.

The wafer loading unit 2 may include, a wafer cassette 2a in which wafers are accommodated and a wafer moving robot 2b that transfers the wafers from the wafer cassette 2a to the wafer adhering unit 3, but the embodiment is not limited thereto. The wafer moving robot 2b may provide the wafer to the wafer adhering unit 3 by flipping the wafer.

The wax coating unit 100 may be configured to spray wax on the block B, rotate the block so that the wax is evenly spread throughout the block, and then heat the block to increase adhesion of the wax. The wax coating unit 100 is configured to apply the wax to the block and simultaneously heat the wax, which will be described in detail below.

The wafer adhering unit 3 may adhere a wafer provided from the wafer loading unit 2 to one surface of the block on which the wax provided from the wax coating unit 100 is coated, and a detailed configuration thereof will be omitted.

The wafer adhered to the block in the wafer adhering unit 3 is transferred to a separate polishing apparatus (not shown), and then the block is mounted on a polishing head, and a polishing process is performed to rotate while a surface of the wafer is in close contact with a polishing pad.

The cleaning unit 4 may clean the wafer adhered to the block B that has completed the polishing process and may be composed of a nozzle and the like as well as an overflowing water tank, but the embodiment is not limited thereto.

The removal unit 5 separates the wafer adhered to the block B provided from the cleaning unit 4 and may include a wafer cassette 5a that accommodates the polished wafer and a pair of blades 5b that separates the wafer from the block B, but the embodiment is not limited thereto.

Figure 3:
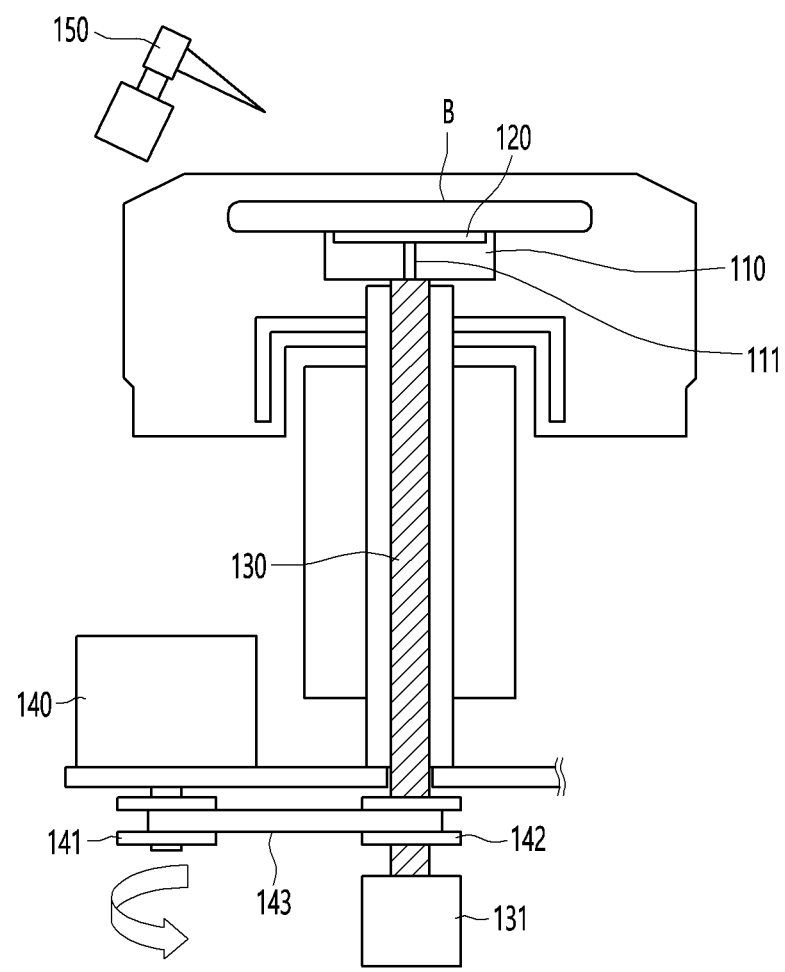
FIG. 3 is a side cross-sectional view illustrating a wax coating apparatus for wafer mounting according to the embodiment.

FIG. 3 is a side cross-sectional view illustrating the wax coating apparatus for wafer mounting according to the embodiment.

As shown in FIG. 3, the wax coating unit 100 of the embodiment may include a vacuum chuck 110 for sucking the block B, a heating plate 120 mounted on an upper side of the vacuum chuck 110 to support and heat the block B at the same time, a rotating shaft 130 connected to a lower side of the vacuum chuck 110, a driving motor 140 providing rotational force to the rotating shaft 130, and a wax nozzle 150 spraying wax on the block B.

The vacuum chuck 110 may be provided so as to fix and support a position of the block B by providing vacuum pressure. The vacuum chuck 110 may have a vacuum flow path 111 embedded perpendicular to a center thereof, and the vacuum flow path 111 may provide vacuum pressure through an external pump or the like.

The heating plate 120 may be mounted on the upper side of the vacuum chuck 110 and may be provided so as to support and heat the block B at the same time. The heating plate 120 may be configured to embed a heater which is a kind of hot wire and may be provided with holes and grooves connected to the vacuum flow path 111 of the vacuum chuck 110 to suck the block B. and is described in detail below.

The rotating shaft 130 may be rotatably mounted at a lower center of the vacuum chuck 110. An upper end of the rotating shaft 130 is connected to a lower portion of the vacuum chuck 110, and a lower end of the rotating shaft 130 may be supported by a rotary union 131.

The driving motor 140 provides rotational force, and first and second belt pulleys 141 and 142 and a belt 143 connecting therebetween may be provided to transfer the rotational force of the driving motor 140 to the rotation shaft. When the driving motor 140 operates, the vacuum chuck 110 connected to the rotating shaft 130 and the heating plate 120 may be integrally rotated.

The wax nozzle 150 may be provided to be spaced apart from the upper side of the vacuum chuck 110 and may spray wax onto the block B sucked to the vacuum chuck 110 and the heating plate 120. The wax is a kind of adhesive for adhering the wafer to the block B and has a characteristic that adhesion increases as a temperature increases.

The heating plate 120, the driving motor 140, and the wax nozzle 150 may operate in conjunction with each other. For example, while the wax nozzle 150 sprays the wax on the block B, when the driving motor 140 operates to rotate the vacuum chuck 110 and the heating plate 120, the wax on the block B may be uniformly coated to the entire surface of the block B by centrifugal force.

As described above, when the heating plate 120 is operated while the wax is coated on the block B, the heating plate 120 may heat the block B to increase a temperature of the wax coated to the block B, and thus coating and heating the wax may be performed at the same time to simplify the process.

Figure 4:
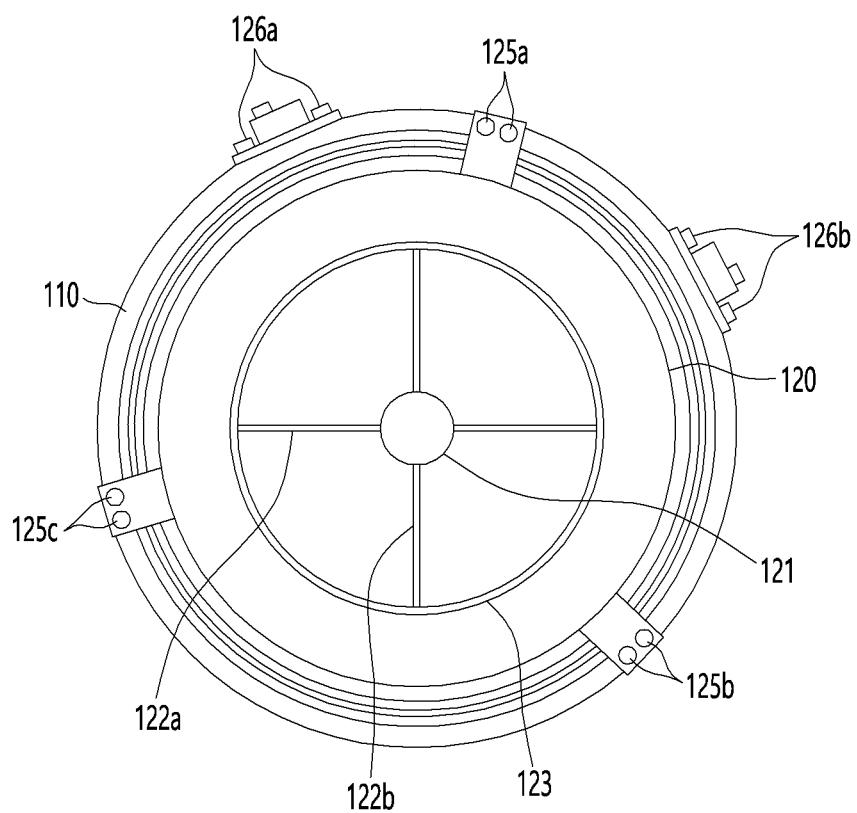
FIG. 4 is a plan view illustrating a heating plate and a vacuum chuck applied to FIG. 3.

FIG. 4 is a plan view illustrating the heating plate and the vacuum chuck applied to FIG. 3.

As shown in FIG. 4, the heating plate 120 according to the embodiment may be mounted on the upper side of the vacuum chuck 110 and may include an upper plate made of a metal with high heat transfer efficiency and a heater embedded on a lower side of the upper plate.

The heating plate 120 has a diameter smaller than a diameter of the block, but it is preferable that the heating plate 120 has a disk shape of which a diameter greater than a radius of the block in order to quickly heat the block.

In order to transfer the vacuum pressure of the vacuum chuck 110, an upper plate of the heating plate 120 may be provided with a hole 121 and grooves 122a for transferring the vacuum pressure.

According to the embodiment, the heating plate 120 may be provided with a central hole 121 provided at a center of the upper plate so as to communicate with the vacuum flow path 111 (shown in FIG. 3) of the vacuum chuck 110, a pair of linear-shaped grooves 122a and 122b orthogonal to each other based on the central hole 121, and ring-shaped groove 123 connecting ends of the linear-shaped grooves 122a and 122b to each other. Of course, it is preferable that a diameter of the center hole 121 is formed to be the largest, and the linear-shaped grooves 122a and 122b and the ring-shaped groove 123 are formed to be thin in a slit shape smaller than the diameter of the center hole 121.

As described above, since the center hole 121, the linear-shaped grooves 122a and 122b, and the ring-shaped groove 123 of the heating plate 120 communicate with each other, vacuum pressure may be provided over the entire upper plate of the heating plate 120.

The heating plate 120 may be seated in a mounting hole (not shown) provided at the center of the vacuum chuck 110, and it is preferable that the heating plate 120 is fixed by a plurality of fastening parts 125a, 125b, 125c, 126a, and 126b so as to rotate integrally like the vacuum chuck 110.

Three upper fastening parts 125a, 125b, and 125c positioned at a predetermined interval in a circumferential direction may fix the upper surface of the heating plate 120 to the upper surface of the vacuum chuck 110 on the upper side, and two side fastening parts 126a and 126b may fix a side surface of the heating plate 120 to a side surface of the vacuum chuck 110, but the embodiment is not limited thereto.

Figure 5:
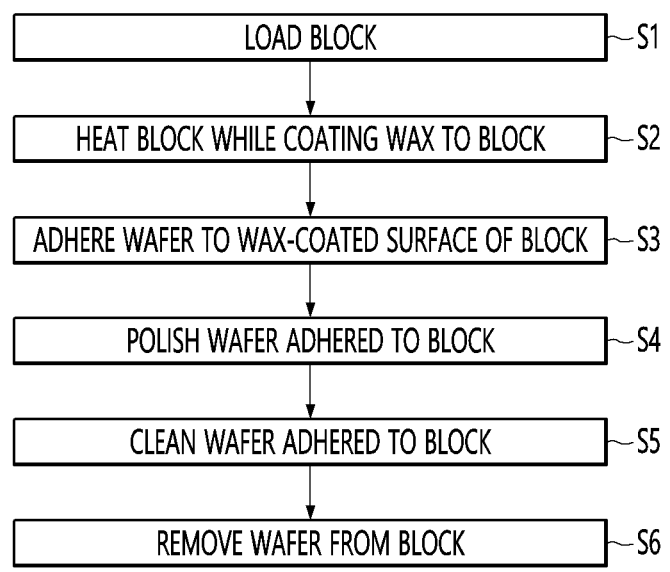
FIG. 5 is a flow chart illustrating a method of mounting the wafer according to the embodiment.

FIG. 5 is a flowchart illustrating a method of mounting a wafer according to the embodiment.

Referring to FIGS. 3 to 5, in the method of mounting the wafer according to the embodiment, a block is loaded into the wax coating unit 100 (see S1).

When the block moving robot 1b seats the block B accommodated in the block cassette 1a on the vacuum chuck 110 and the heating plate 120, vacuum pressure is provided on the upper side of the heating plate 120 through the vacuum flow path 111 of the vacuum chuck 110, and the block B may be fixed to the heating plate 120 by the vacuum pressure.

Next, the wax is coated to the block B in the wax coating unit 100 and the block B is heated at the same time (see S2).

While the wax nozzle 150 sprays wax onto the block B sucked on the heating plate 120, the driving motor 140 operates to rotate the vacuum chuck 110 and the heating plate 120, the wax is uniformly coated to the entire block B by centrifugal force, and the heating plate 120 operates to heat the block B, thereby increasing the adhesion by increasing the temperature of the wax coated to the block B, Even through the block B is not moved, the wax is coated to the block B by the wax coating unit 100 and the block B is heated at the same time, thereby simplifying the process and reducing the production time to increase productivity.

Next, the wafer is adhered to a wax-coated surface of the block B (see S3).

When the block B on which the wax is coated in the wax coating unit 100 is provided to the wafer adhering unit 3, the wafer is flipped in the wafer loading unit 1 and is provided to the wafer adhering unit 3, and the wafer may be adhered to one surface of the block B on which the wax is coated.

Next, the wafer adhered to the block B is polished. (See S4)

When the wafer adhered to the block B in the wafer adhering unit 3 is provided to a separate polishing apparatus (not shown), the block B is mounted on the polishing head and the polishing process is performed while rotating in a state in which the surface of the wafer is in close contact with the polishing pad.

Next, a polished wafer is cleaned while being adhered to the block B, and then the polished wafer is removed from the block B (see S5 and S6).

When the wafer polished in the polishing apparatus is provided to the cleaning unit 4, the polished wafer is cleaned while being adhered to the block B.

When the block B to which the wafer washed in the cleaning unit 4 is adhered is provided to the removal unit 5, the blades 5b are separated the polished wafer from the block B, and then a separate wafer cassette 5a, and the block B from which the wafer is separated may be used repeatedly through a separate cleaning process.

The above-described descriptions are merely an example of the technological spirit of the present invention, and various modifications and variations may be made by those having ordinary skill in the art to which the present invention pertains without departing from the essential characteristics of the present invention.

Therefore, the embodiments disclosed in the present invention are not intended to limit the technological spirit of the present invention, but the embodiments are intended to describe, and the spirit and scope of the present invention is not limited by such embodiments.

The protection scope of the present invention should be construed by the following claims, and all technological spirits within the equivalent scope thereof should be construed as being included in the scope of right of the present invention.

| Description of reference numerals | |
| --- | --- |
| 100: Wax coating unit | 110: Vacuum chuck |
| 120: Heating plate | 130: Rotating shaft |
| 140: Driving motor | 150: Wax nozzle |

What is claimed is:

1. A wax coating apparatus for wafer mounting, the wax coating apparatus comprising:
   a vacuum chuck in which a vacuum flow path providing vacuum pressure is embedded;
   a heating plate mounted on an upper side of the vacuum chuck and having holes and grooves connected to the vacuum flow path of the vacuum chuck in order to suck a block to which a wafer is adhered;
   a rotating shaft connected to a lower side of the vacuum chuck;
   a driving motor for rotating the rotating shaft; and
   a wax nozzle provided to be spaced apart from the upper side of the vacuum chuck,
   wherein the heating plate includes an upper plate and is operated so as to heat the block while the wax nozzle sprays wax on the block,
   wherein the upper plate includes a central hole communicating with the vacuum flow path of the vacuum chuck at a center thereof,
   a pair of linear-shaped grooves crossing each other based on the central hole, and a ring-shaped groove connecting both ends of the linear-shaped grooves to each other.

2. The wax coating apparatus of claim 1, wherein the driving motor is configured to rotate the vacuum chuck by the rotating shaft while the wax nozzle sprays the wax to the block, and the heating plate is operated in conjunction with at least one of the driving motor and the wax nozzle.

3. The wax coating apparatus of claim 1, wherein the heating plate is mounted on the upper side of the vacuum chuck by a plurality of fastening parts positioned at a predetermined interval in a circumferential direction.

4. The wax coating apparatus of claim 1, wherein the heating plate is composed of a disk shape of which a diameter smaller than a diameter of the block and greater than a radius of the block.

5. The wax coating apparatus of claim 1, wherein the upper plate is made of a metal and a heater is adhered to a lower side of the upper plate.

6. A wafer mounting apparatus comprising: a block loading unit for providing the block; a wafer loading unit for providing the wafer; the wax coating apparatus according to claim 1 that is configured to heat the block while coating wax to the block provided from the block loading unit; and a wafer adhering unit that is configured to adhere the wafer provided from the wafer loading unit to a wax-coated surface of the block provided from the wax coating apparatus.

7. A wafer mounting apparatus comprising: a block loading unit for providing the block; a wafer loading unit for providing the wafer; the wax coating apparatus according to claim 2 that is configured to heat the block while coating wax to the block provided from the block loading unit; and a wafer adhering unit that is configured to adhere the wafer provided from the wafer loading unit to a wax-coated surface of the block provided from the wax coating apparatus.

8. A wafer mounting apparatus comprising: a block loading unit for providing the block; a wafer loading unit for providing the wafer; the wax coating apparatus according to claim 3 that is configured to heat the block while coating wax to the block provided from the block loading unit; and a wafer adhering unit that is configured to adhere the wafer provided from the wafer loading unit to a wax-coated surface of the block provided from the wax coating apparatus.

9. A wafer mounting apparatus comprising: a block loading unit for providing the block; a wafer loading unit for providing the wafer; the wax coating apparatus according to claim 4 that is configured to heat the block while coating wax to the block provided from the block loading unit; and a wafer adhering unit that is configured to adhere the wafer provided from the wafer loading unit to a wax-coated surface of the block provided from the wax coating apparatus.

10. A wafer mounting apparatus comprising: a block loading unit for providing the block; a wafer loading unit for providing the wafer; the wax coating apparatus according to claim 5 that is configured to heat the block while coating wax to the block provided from the block loading unit; and a wafer adhering unit that is configured to adhere the wafer provided from the wafer loading unit to a wax-coated surface of the block provided from the wax coating apparatus.

* * * * *